United States Patent
Henstra et al.

(10) Patent No.: US 11,450,505 B2
(45) Date of Patent: Sep. 20, 2022

(54) MAGNETIC FIELD FREE SAMPLE PLANE FOR CHARGED PARTICLE MICROSCOPE

(71) Applicant: FEI Company, Hillsboro, OR (US)

(72) Inventors: Alexander Henstra, Eindhoven (NL); Ali Mohammadi-Gheidari, Eindhoven (NL); Peter Christiaan Tiemeijer, Eindhoven (NL)

(73) Assignee: FEI Company, Hillsboro, OR (US)

(*) Notice: Subject to any disclaimer, the term of this patent is extended or adjusted under 35 U.S.C. 154(b) by 0 days.

(21) Appl. No.: 17/130,987

(22) Filed: Dec. 22, 2020

(65) Prior Publication Data
US 2022/0199353 A1   Jun. 23, 2022

(51) Int. Cl.
*H01J 37/14*   (2006.01)
*H01J 37/28*   (2006.01)

(52) U.S. Cl.
CPC .............. *H01J 37/14* (2013.01); *H01J 37/28* (2013.01); *H01J 2237/1035* (2013.01); *H01J 2237/141* (2013.01); *H01J 2237/1415* (2013.01)

(58) Field of Classification Search
CPC ........ H01J 37/14; H01J 37/141; H01J 37/295; H01J 37/2955; H01J 2237/1035; H01J 2237/141; H01J 2237/1415
See application file for complete search history.

(56) References Cited

U.S. PATENT DOCUMENTS

| | | | |
|---|---|---|---|
| 10,224,173 B2* | 3/2019 | Naruse | H01J 37/141 |
| 2009/0206258 A1* | 8/2009 | Kasai | H01J 37/20 250/311 |
| 2020/0312612 A1* | 10/2020 | Kohno | H01J 37/21 |

\* cited by examiner

*Primary Examiner* — David E Smith (57) ABSTRACT

An adjustable magnetic field free objective lens for a charged particle microscope is disclosed herein. An example charged particle microscope at least includes first and second optical elements arranged on opposing sides of a sample plane, a third optical element arranged around the sample plane, and a controller coupled to control the first, second and third optical elements. The controller coupled to excite the first and second optical elements to generate first and second magnetic lenses, the first and second magnetic lenses formed on opposing sides of the sample plane and oriented in the same direction, and excite the third optical element to generate a third magnetic lens at the sample plane that is oriented in an opposite direction, where a ratio of the excitation of the third optical element to the excitation of the first and second optical elements adjusts a magnetic field at the sample plane.

23 Claims, 5 Drawing Sheets

MAGNETIC FIELD FREE SAMPLE PLANE FOR CHARGED PARTICLE MICROSCOPE

FIELD OF THE INVENTION

The invention relates generally to charged particle microscope lenses, and specifically to charged particle microscope objective lenses that produce negligible or zero magnetic field at a sample plane.

BACKGROUND OF THE INVENTION

Magnetic lenses are used in charged particle microscopy as an objective lens when the charged particles are of high energy. The objective lens is used for focusing and imaging the charged particle beam. Such objective lenses have reduced focal distances due to the use of strong magnetic fields near or around a sample. While this is not an issue for most materials, sensitive magnetic materials may be damaged or destroyed if imaged in such a lens configuration. A conventional approach may include moving the magnetic lens farther away from the sample to reduce or eliminate the magnetic field at the sample. Such approach, however, results in an increase in focal length, which degrades the resolution of the charged particle microscope. Although such technique to image magnetic materials provides some capability, reduced resolution is still a problem and further improvements are desired.

SUMMARY

An example apparatus for changing a magnetic field in a sample plane of an electron microscope, such as a TEM or an STEM, is disclosed herein. The example apparatus at least includes first and second optical elements, the first and second optical elements arranged around the sample plane. The arrangement of the first and second optical elements can be above and below the sample plane, where above and below are along an optical axis of the electron microscope. The microscope further includes a third optical element, also arranged around the sample plane. Additionally, the electron microscope includes a controller coupled to control the first, second and third optical elements to affect the magnetic field at the sample plane. The controller may be coupled to or including non-transitory memory storing code that, when executed by the controller, causes the controller to excite the first and second optical elements to generate first and second magnetic lenses formed around the sample plane, the first and second lenses oriented in the same direction; and excite the third optical element to generate a third magnetic lens at the sample plane, the third magnetic lens oriented in an opposite direction to the first and second magnetic lenses, and wherein a ratio of the excitation of the first and second optical elements to the excitation of the third optical element adjusts a magnetic field at the sample plane. The adjustment of the magnetic field is due to the interaction at the sample plane of the third magnetic lens and magnetic fields present at the sample plane from the first and second magnetic lenses.

An example method for changing a magnetic field in a sample plane of an electron microscope is disclosed herein. The example method at least includes forming first and second magnetic lenses around a sample plane based on an excitation of first and second coils, wherein the first and second magnetic fields are oriented in the same direction and are symmetrically arranged on opposing sides of the sample plane, forming a third magnetic lens at the sample plane based on an excitation of a third coil, wherein the third magnetic field is oriented in an opposite direction of the orientation of the first and second magnetic lenses; and based on a ratio of the excitation of the third coil to the excitation of the first and second coils to the excitation of the at least third coil, adjusting a magnetic field at the sample plane.

BRIEF DESCRIPTION OF THE DRAWINGS

Like reference numerals refer to corresponding parts throughout the several views of the drawings.

DETAILED DESCRIPTION OF EMBODIMENTS

Embodiments of the present invention are described below in the context of a charged particle microscope including one or more objective lenses that are configured to form an adjustable magnetic field at a sample plane. For example, three lenses may be arranged around the sample plane and energized to negate or generate a small magnetic field at the sample plane. In some embodiments, field free objective lenses are energized symmetrically or near symmetrically while an immersion objective lens is energized opposite to the field free objective lenses. In such an embodiment, the excitation of the immersion objective lens reduces or negates the magnetic field generated at the sample plane due to the field free objective lenses. However, it should be understood that the methods described herein are generally applicable to a wide range of different tomographic methods and apparatus, including both cone-beam and parallel beam systems, and are not limited to any particular apparatus type, beam type, object type, length scale, or scanning trajectory As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatuses are referred to as "lowest", "best", "minimum," or the like. It will be appreciated that such descriptions are intended to indicate that a selection among many used functional alternatives can be made, and such selections need not be better, smaller, or otherwise preferable to other selections.

In the charged particle microscope, the charged particles are focused and imaged by so-called 'charged particle lenses'. These lenses can be made by properly shaping magnetic or electric fields. However, for electron microscopes operating at beam potentials above 60 kV, as is typical for the transmission electron microscope (TEM) or the scanning transmission electron microscope (STEM), lenses made of electric fields are impracticable due to the large electric fields required. For these types of microscopes, the preferred method of making charged particle lenses is to use magnetic fields.

Conventionally, a magnetic lens is constituted as follows: A coil that carries hundreds of windings is positioned rotationally symmetrically around the optical axis of the microscope. The coil is excited by a current of several Amperes. At such high currents, the electrical resistance of the wire in the coil can lead to large power dissipation. This is typically handled by using water cooling of the coil and by using wire with a large diameter. Such coils have a diameter of at least approximately ten centimeter and a cross-section (perpendicular to the current) of at least approximately ten square centimeters. While excited, the coil creates a strong magnetic field on the optical axis of the microscope in the axial direction (that is, parallel to the optical axis). Since the magnetic field is divergence-free, it inherently has components in the radial direction (that is, perpendicular to the optical axis). These radial components grow linearly with the distance to the optical axis, and their net effect is a deflection of the charged particles towards the optical axis that scales linearly with the distance of these particles to the optical axis. Hence, such magnetic field acts as a round focusing lens.

The focusing strength of a magnetic lens scales with the square of the axial magnetic field and with the length of the axial magnetic field (as measured along the optical axis). Therefore, in order to obtain a strong magnetic lens, it is common to concentrate the magnetic field in a small region on the optical axis by employing a magnetic yoke around the coil to guide and focus its magnetic flux to a small region on the axis. Such small region may have only a few millimeters length. Although the magnetic lens is constituted by the whole construction of yoke, coil, and water cooling, the term 'magnetic lens' as used herein refers only to the small region near the axis where the axial magnetic field is concentrated. Additionally, the term 'optical element' as used herein refers to the construction (i.e., coils, yokes) that generate the magnetic field that forms the magnetic lens.

Strong lenses are desirable since they have the highest magnification and since they have the least aberrations. Here aberrations mean deviations from the ideal linear focusing effect. One of the most important aberrations is spherical aberration, which causes an additional focusing effect that scales with the third power of the distance of the particle to the optical axis. The spherical aberration of a magnetic lens scales approximately linearly with the length of the magnetic field (as measured along the optical axis) and with the third power of the focal distance of the magnetic lens.

The resolution of the charged particle microscope is dominated by the optical quality of the objective lens. The objective lens is the first imaging lens in case of an imaging microscope such as a TEM, or it is the final probe-forming lens in case of a scanning microscope such as an SEM or STEM. Therefore, for the best resolution, it is desirable that the objective lens is as close as possible to the specimen (to minimize the focal distance) and that the length of its magnetic field is as short as possible. To this end, modern charged particle microscopes often employ a so-called immersion objective lens, in which the specimen is inside the field of the objective lens. Such immersion ensures minimum focal length and minimum field length.

Immersion of the specimen in the magnetic field of the objective lens is allowed for a large range of specimens. However, for some types of specimens immersion is not allowed because these specimens contain, for example, delicate magnetic structures (such as magnetic grains or magnetic vortices) which are changed or destroyed in the presence of an external magnetic field. Such specimens can only be studied in 'field-free' conditions, that is, using an objective lens which is not of the immersion type and which does not create a magnetic field at the specimen. Prior approaches for creating the field-free condition is to move the objective lens sufficiently far away from the specimen so that the tails of its magnetic field have sufficiently dropped to zero as to not affect possible delicate magnetic structures in the specimen. However, this straightforward approach usually requires such a large distance between the objective lens and the specimen (and a correspondingly large focal distance and large aberrations) that resolution is reduced by up to a factor ten compared to an immersion lens, and that atomic resolution is no longer attainable.

For some specimens with magnetic structures, it is desirable to image the specimen not-only in (essentially) field-free condition, but also in the presence of a small and tunable magnetic field. Such field can then be varied so as to study the response of the magnetic structures as a function of applied external field.

One technique for creating an objective lens which is relatively close to the specimen and which has minimum magnetic tails at the specimen is to generate two symmetrically arranged and excited magnetic field free lenses on opposing sides of a sample plane while simultaneously generating a (small) immersion objective lens at the sample plane. The two magnetic field free lenses are excited equally in magnitude so that their magnetic fields are oriented in the same direction, whereas the immersion objective lens is excited so that its magnetic field is oriented in the opposite direction. As such, any magnetic field leakage from the magnetic field free lenses to the sample plane will interact with the magnetic field of the immersion objective lens such that the resulting magnetic field is either reduced or eliminated. The ratio of the excitation of the immersion lens to the excitation of the magnetic field free lenses will determine the state of the resulting magnetic field, e.g., zeroed out or reduced to a small magnetic field (such small and tunable magnetic field is advantageous for studying the response of magnetic samples to an external magnetic field, for example). The reduction or elimination of the magnetic field at the sample plane may only be in direction of the optical axis, e.g., a z-component of the resulting magnetic field, whereas the X and Y components (or radial component) may be reduced for a small distance from the optical axis before increasing. The excitation magnitude that generates the immersion objective lens may be less than the excitation magnitude that generates the magnetic field free lenses. As noted, this relative operating configuration will allow either a small magnetic field to be generated at the sample plane or for the magnetic field to be zeroed out at the sample plane. As such, the magnetic field at the sample plan can be adjusted by changing the ratio of the excitations.

Figure 1:
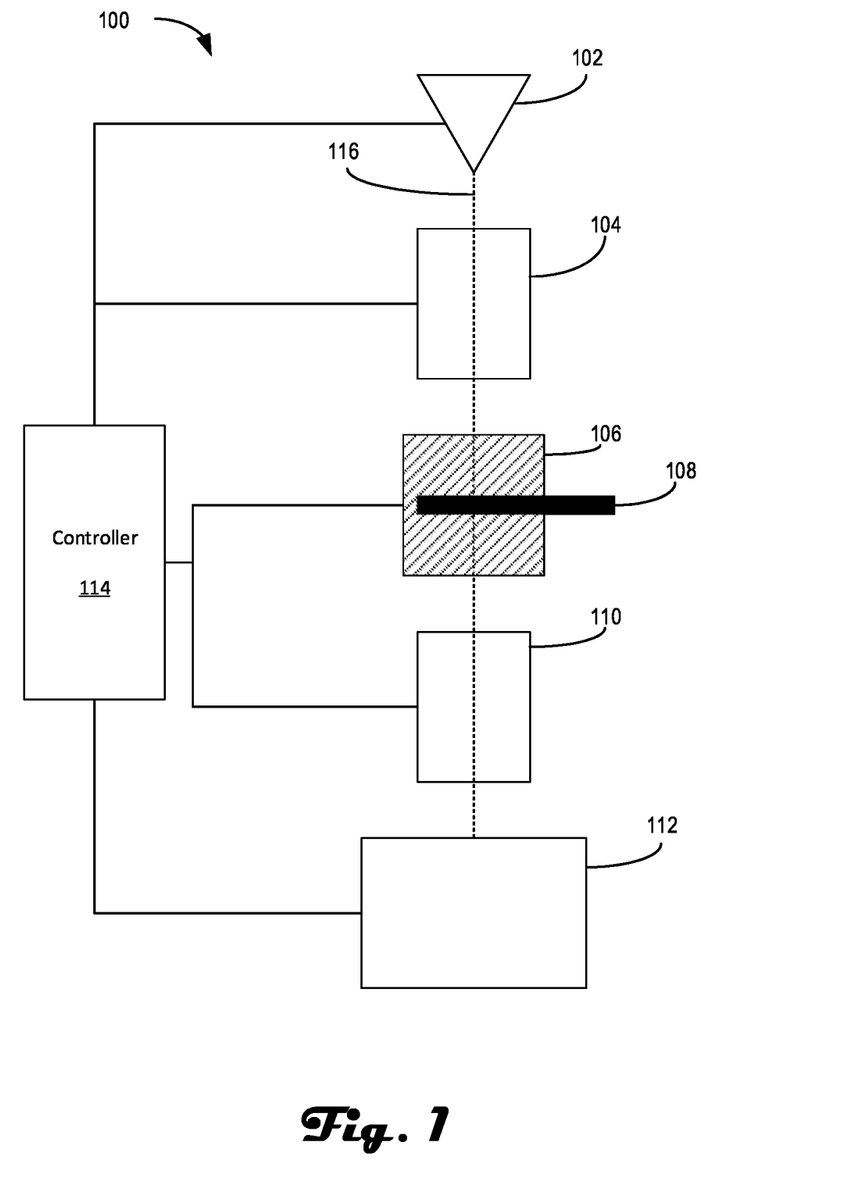
FIG. 1 is an illustrative charged particle microscope in accordance with an embodiment of the present disclosure.

FIG. 1 is an illustrative charged particle microscope 100 in accordance with an embodiment of the present disclosure. The charged particle microscope (CPM) 100 may be a TEM or a scanning TEM (STEM) in some examples, but such designation is not limiting or required. CPM 100 may include an objective lens arranged and configured so that a magnetic field at a sample plane may be adjusted. For example, the objective lens may be excited so that no magnetic field, at least in the direction of an optical axis, is generated at the sample plane, or that only a small magnetic field is generated at the sample plane. It should also be noted that the radial component of the magnetic field may be present but also reduced for some radial distance from the optical axis. By changing the level of magnetic field present at the sample plane, magnetic materials can be imaged in various magnetic states. Alternatively, the objective lens may be excited so that more conventional lens characteristics are produced, e.g., a strong magnetic field generated at the sample plane, to form a conventional immersion lens. CPM 100 at least includes a source 102, a condenser system 104, objective lens 106, sample holder 108, projection system 110, detector 112, and a controller 114. The various components 102-112 may be coupled to the controller 114 for controlling their functional aspects, such as lens excitation, projection control and detector selection/data processing. It should be noted that CPM 100 may have additional or fewer components, and the components included in CPM 100 is for illustrative purposes only and is not limiting to the present disclosure.

Source 102 may be any type of charged particle emitter, such as a Schottky, field emission or thermionic. Controller 114 provides control signals to one or more power supplies (not shown) coupled to source 102 for generating a charged particle beam 116 of a desired current and energy. In some embodiments, source 102 produces and emits a beam of electrons at an energy and current controlled by controller 114.

Condenser system 104 includes various optics and beam manipulation components arranged and configured to direct and/or focus beam 116 toward a sample in the sample holder 108. Controller 114 provides control signals that determine shape and focus of beam 116 at different planes within CPM 100 and controls movement of beam 116 across the sample on the sample holder 108.

Sample holder 108 may be an elongate rod capable of moving in and out of the optical axis of CPM, illustrated by beam 116 in FIG. 1, and is formed to hold a sample so that electrons, for example, hitting the sample continue along the optical axis for eventual detection by detector 112. The location of sample holder 108 is located at the sample plane as referred to herein. Additionally, sample holder 108 can be positioned in multiple degrees of freedom by a positioning device (not shown) that moves the sample, for example, in the XY plane, which is normal to the optical axis. Such movement allows different parts of the specimen S to be illuminated/imaged/inspected by the electron beam 116 traveling along the optical axis (in the Z direction) (and/or allows scanning motion to be performed, as an alternative to beam scanning). If desired, an optional cooling device (not depicted) can be brought into thermal contact with the specimen holder H, to maintain it (and the specimen S thereupon) at cryogenic temperatures, for example.

Projection system 110 may include various electrostatic/magnetic lenses, deflectors, correctors (such as stigmators), and the like, that are controlled to focus the beam 116 that traverses the sample onto detector 112.

Detector 112 may comprise a number of different detector modules that may be independently moved into the optical path to acquire the transmitted charged particles that traversed the sample. The number of different detectors may at least include a fluorescent screen that can be imaged with a CCD, for example, a solid state sensor configured for direct detection of charged particles, such as electrons, and/or a segmented detector capable of mapping a location of impinging charged particles. Of course, other detectors are also within the bounds of this disclosure.

Controller 114 is coupled to control and receive data from the various other components of CPM 100. The controller 114 can provide a variety of functions, such as synchronizing actions, providing setpoints, processing signals, performing calculations, and displaying messages/information on a display device (not depicted). Additionally, controller 114 may include one or more processing cores, various types of memory, and one or more communication interfaces. In some examples, controller 114 may be connected to a cloud-based processing system and data bank(s) via any type of network, such as the internet, local area network or wide area network. The memory, whether included in controller 114 or coupled to controller 114 via a network, may include executable code that, when executed, controls the functioning of CPM 100 in accordance with techniques discussed herein.

Objective lens 106 is arranged around sample holder 108 and includes a plurality of optical elements. As used herein, the term 'optical element' indicates a construction that generates a magnetic field at the optical axis. Conventionally, an optical element comprises one or more coils surrounded by a magnetic yoke which is shaped to guide magnetic flux generated by the enclosed coils, when excited, to a small region at the optical axis. Each of the optical elements generates a respective magnetic lens along the optical path within the objective lens 106. The plurality of magnetic lenses generated at least include two field free objective lenses and an immersion objective lens. The two field free objective lenses are formed around the sample plane. As used herein, around the sample plane means the two magnetic lenses are formed above and below the sample plane in a direction parallel with the optical axis of CPM 100, as represented by electron beam 116, or, stated another way, arranged on opposing sides of the sample plane 108. The two magnetic field free lenses can be arranged symmetrically around the sample plane 108 or arranged near symmetrically around the sample plane 108. As used herein, "arranged symmetrically around the sample plane" means that each of the two magnetic field free lenses are formed at equal distances from the sample plane, but on opposing sides of the sample plane, whereas "arranged near symmetrically around the sample plane" means the distance from the sample plane to each of the magnetic field free lenses is not equal, such that one can be closer to or farther from the sample plane than the other. The immersion objective lens is formed at the sample plane and will be generated in a volume that includes the sample plane.

The two magnetic field free objective lenses are formed from respective optical elements, which include respective coils having a yoke wrapped around with the yoke having pole pieces that extend therefrom toward the sample plane 108. The coils, yoke and pole pieces are arranged on opposing sides of the sample plane 108, and the pole pieces extend toward the sample plane 108. The immersion objective lens may be formed from one or more coils arranged laterally adjacent to one or both of the coils/yokes of the two optical elements. The coils of the objective lens may be of different sizes or all the same size, where size refers to the number of windings. As is understood in the art, the excitation of the coils, usually referred to in terms of ampere-turns (AT), determines the strength and orientation of the lenses formed thereby.

In operation, the controller 114 causes the objective lens 106 to be excited by one or more power supplies (not shown) in various ways so that a magnetic field at the sample plane is adjusted. For example, the objective lens 106 may be excited so that there is no magnetic field at the sample plane, at least along the optical axis, e.g., a z-component of the magnetic field. Alternatively, the objective lens 106 may be excited so that a small magnetic field, again in the direction of the optical axis, is generated at the sample plane. The negation of the electric field or the generation of a small electric field allows for imaging and analysis of magnetic materials, for example. Additionally, the objective lens 106 may be operated in a more conventional manner so that a strong immersion lens is formed at the sample plane. Such flexibility of providing magnetic field free imaging, small magnetic field imaging and conventional imaging may be attributed to the coil design and the symmetry of the various components within the objective lens 106.

In some embodiments, the coils that form the field free objective lenses are excited symmetrically and in the same direction, e.g., same sign of bias, while the coil or coils that form the immersion objective lens is/are excited oppositely of the field free objective lens coils. The excitation of the coils that form the field free objective lens and the excitation of the coil(s) that form the immersion objective lens leads to either a zeroing out of the z-component of the magnetic field at the sample plane or the generation of the small magnetic field in the z-direction. More specifically, a ratio of the two excitations may determine whether the magnetic field at the sample plane 108 is zeroed out or reduced. To further illustrate, magnetic fields from the two magnetic field free lenses may leak and extend into the sample plane 108 while the objective immersion lens combines with the leaked magnetic fields to zero or reduce the magnetic field at the sample plane. This combined magnetic field will have a strength depending on the ratio of the excitations. It should also be noted that the physical arrangement of the two sets of lenses with respect to the sample plane also affects the magnetic field at the sample plane. It should further be noted that the coils of the field free objective lenses need not be excited equally, and instead one coil can be excited at a fraction or multiple of the other coil. Such fraction or multiple can be in a range of 0.5 to 2, for example.

Figure 2:
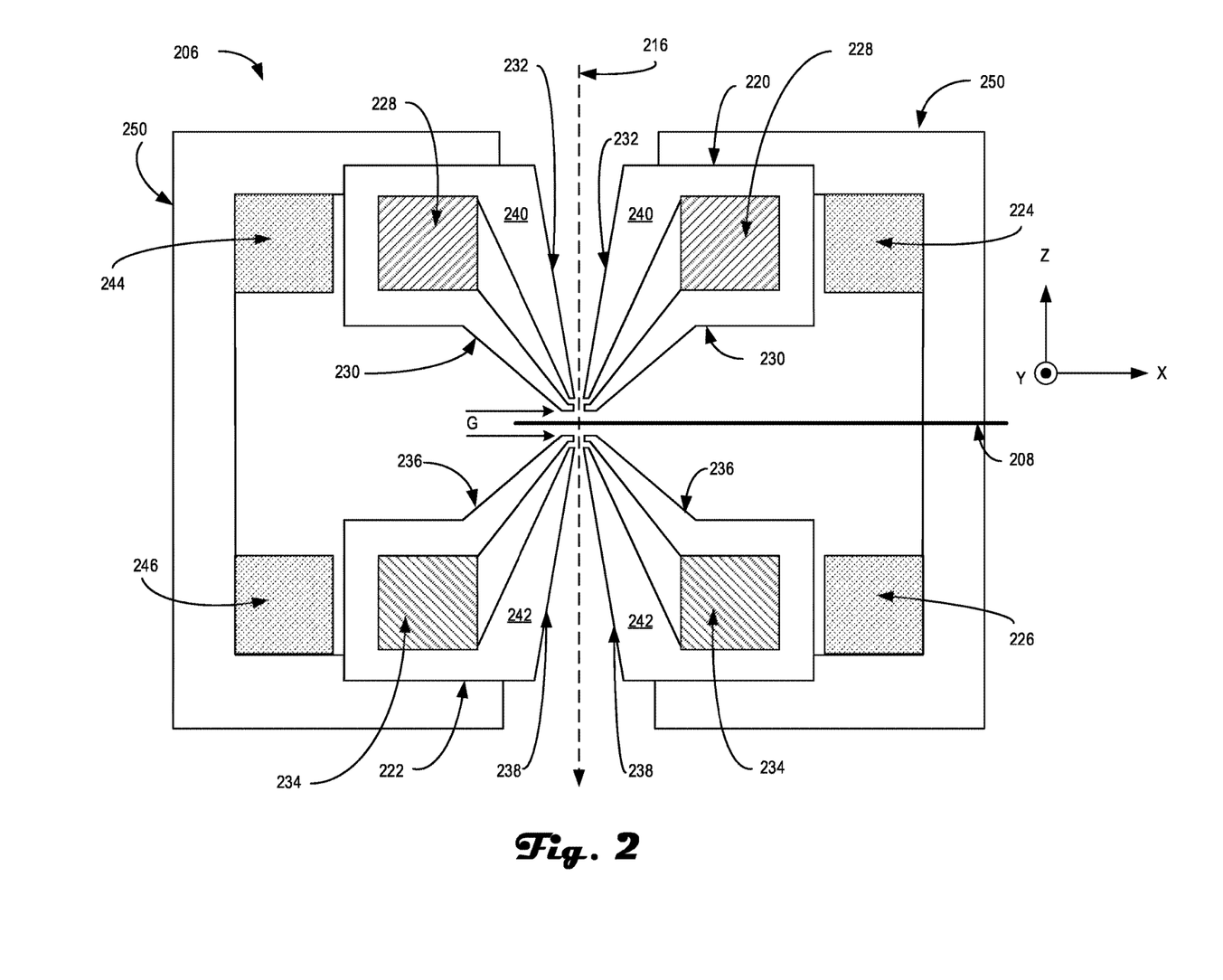
FIG. 2 is an illustrative objective lens in accordance with an embodiment of the present disclosure.

FIG. 2 is an illustrative objective lens 206 in accordance with an embodiment of the present disclosure. The illustration shows a cross-section of objective lens 206. The objective lens 206 is an example of objective lens 106, and may be included in a charged particle microscope, such as a TEM or an STEM, to name a couple examples. Objective lens 206 may be arranged around a sample plane 208, which represents a location within a CPM that a sample will be located for image acquisition. Objective lens 206 may be operated in a conventional mode where large magnetic fields are present at sample plan 208, e.g., an immersion mode, or objective lens 206 may be operated in a magnetic field free mode, e.g., little or no magnetic field present at the sample plane. To study magnetic materials, it is useful to be able to zero out and/or generate a small magnetic field at the sample plane location as desired.

Objective lens 206 includes at least three optical elements. A first optical element 220 is arranged on one side of sample plane 208, and a second optical element 222 is arranged on an opposite side of the sample plane 208. The sides of the optical plane are in reference to optical axis 216, which may be an optical axis for propagation of an electron beam, for example. The third optical element includes coils 244 and 246, and further includes retaining element 250 and portions of yokes 240 and 242. The present example shows an embodiment where the third optical element comprises two coils (244 and 246). The advantage of such separation in two coils is that it allows for easy access of the sample holder 208 to the optical axis. Alternatively, the third element may include only one coil (244 or 246). The retaining element 250 can act as a magnetic field applicator under certain operating conditions. The third optical element is also arranged around the sample plane 208, e.g., on both sides of the sample plane, and further arranged adjacent to the first and second optical elements, respectively. Additionally, first and second optical elements 220, 222 are disposed such that a gap G is formed between their respective pole pieces, where the gap is formed around sample plane 208. While FIG. 2 shows a cross-section of objective lens 206, the various components may be formed into toroidal shapes that are centered on the optical axis 216.

A first optical element 220 includes coil 228 and yoke 240. The yoke 240 is shaped such that first and second pole pieces 230 and 232 are formed and extend toward sample plane 208. The two pole pieces 230 and 232 are separated by a gap at their respective ends. A second optical element 222 includes coil 234 and yoke 242. The yoke 242 is shaped such that first and second pole pieces 236 and 238 are formed and that extend toward sample plane 208. Similarly, the two pole pieces 236 and 238 are separated by a gap at their respective ends. The gap G is formed from the distance between the pole piece 230 of the first optical element 220 and the pole piece 236 of the second optical element 222, where the gap G surrounds the sample plane 208.

The third optical element is formed by the coils 244 and 246, a portion of yoke 240 that at least incudes pole piece 230, retaining element 250, and a portion of yoke 242 that includes pole piece 236. Alternatively, the third optical element may have only one coil (such as coil 244 or coil 246). The third optical element can be located laterally adjacent to the first and second optical elements 220 and 222, respectively, but in general it may be located at substantially equal distances from the sample plane 208 on opposing sides.

The first and second coils 228 and 234 may be configured similarly in terms of windings. The third and fourth coils 244 and 246 may likewise be configured similarly to one another. In some embodiments, all four coils 228, 234, 244 and 246 are similar in size. In other embodiments, however, the first and second coils 228, 234 may be larger or smaller than the third and fourth coils 244, 246.

In operation, objective lens 206 may be energized to control a charge particle beam traveling along the optical axis 216, and to further manage/adjust/change/modify a magnetic field at the sample plane 208. The excitation of the first and second optical elements 220, 222 and/or the third and fourth coils 244, 246 may form a plurality of magnetic lenses within objective lens 206. For example, excitation of the first optical element 220 forms a first magnetic field lens at the end of the pole pieces 230 and 232. Similarly, excitation of the second optical element 222 forms a second magnetic field lens at the end of the pole pieces 236 and 238. The first and second magnetic field lenses may also be referred to as magnetic field free lenses, as is known in the art. The third optical element may also be excited to form an immersion objective lens at the sample plane 208. The immersion objective lens may be generated by the excitation of one or both of the coils 244 and 246.

For example, in some embodiments, the first and second optical elements 220, 222 are excited symmetrically, meaning they are excited with the same energy and generate magnetic fields in the same orientation, while the third and/or fourth coils 244, 246, i.e., the third optical element, are exited symmetrically to each other but their resulting magnetic field is in an opposite orientation to the field generated by the first and second optical elements 220, 222. For example, the first and second optical elements 220, 222 may be excited at 4000 ampere-turns (AT), while the third and/or fourth coils 244, 246 are excited at −18 AT. In other embodiments, the excitations of the first and second optical elements may not be symmetrical with regards to energy, e.g., magnitude of a bias, and instead, one of the first or second optical elements may be excited with a magnitude that is a fraction or multiple of the excitation provided to the other optical element. The fraction/multiple is relative to the magnitude of the excitation, but the sign of the excitation will be the same. The fraction/multiple can be in the range of 0.5 to 2, for example. Of course, other excitations are possible, and the chosen excitations may be based on the desired magnetic field state at the sample plane.

In the above excitation regime, a magnetic field of both the first and second magnetic field lenses may leak toward the sample plane 208. This magnetic field leakage will combine additively since the two lenses are oriented in the same direction. However, the immersion objective lens generated at the sample plane will also combine with the leakage magnetic field with the resulting magnetic field being either small or zeroed out since the immersion objective lens has an opposing orientation. Whether the magnetic field at the sample plane is negated or reduced depends on the relative excitation of the first and second optical elements to the third optical element. More specifically, a ratio of the excitation of the third optical element to the excitation of the first and second optical elements will adjust the magnetic field at the sample plane. For example, for the geometry in FIG. 2 and for an electron acceleration voltage of 300 kV, the first and second optical elements can be excited to 4000 AT to generate magnetic lenses that focus electrons of 300 keV energy at the sample plane, and the third optical element can be excited to −18 AT to zero out the z-component of the magnetic field at the sample plane 208. Similarly, for the geometry in FIG. 2 and an electron acceleration voltage of 100 kV, the excitations of the first and second optical elements may be 2100 AT to generate lenses that focus electrons of 100 keV at the sample plane. The excitation of the third optical element may be set to −9.5 AT to zero out the z-component of the magnetic field at the sample plane 208. For these two examples of the acceleration voltages, the ratios of the excitations of the third optical element to the first and second optical elements are constant: −18:4000=−9.5:2100=−0.45%. The skilled artisan will understand that the constancy of this ratio is a consequence of the linear relation between coil excitation and magnetic field, and that this linearity can be compromised by magnetic saturation that may occur for high excitation and/or for narrow magnetic yokes, and that this ratio will depend somewhat on the excitations in the presence of magnetic saturation.

The excitation of 4000 AT of the first and second optical elements is valid for the geometry shown in FIG. 2 and electrons of 300 keV beam energy. For other embodiments, the excitations of the first and second optical elements required to focus electrons of 300 keV can vary between 2000 AT and 8000 AT, depending on the chosen gap between the pole pieces 230 and 240, the gap between 236 and 242, the inner diameter of the pole pieces, and further depending on the possible magnetic saturation within the pole pieces. Similarly, the ratio between the excitation of the third optical element and the excitation of the first and second optical elements required to zero out the magnetic field at the sample can vary between −0.01% and −5%, depending on the chosen geometry.

It should be noted that the symmetry or near symmetry of the excitation of the optical elements to reduce or eliminate the magnetic field at the sample plane 208 may not be the only factors in arriving at the resulting magnetic field. The physical symmetry of the objective lens 206 also affects the adjustment of the magnetic field. For example, the symmetry of the pole pieces 230, 232 and 236, 238 affects how the magnetic fields generated by the first and second optical elements interact, along with the immersion lens formed at the sample plane. In such a scenario where the sample plane is not centered within the gap G, the relative excitations of the first and second optical elements may be adjusted to account for the offset sample plane 208. For example, the optical element farther away from the sample plane 208 may receive a stronger excitation than the other optical element. Of course, the opposite excitation regime, e.g., the closer optical element receiving a lower excitation, may also be performed.

Figure 3:
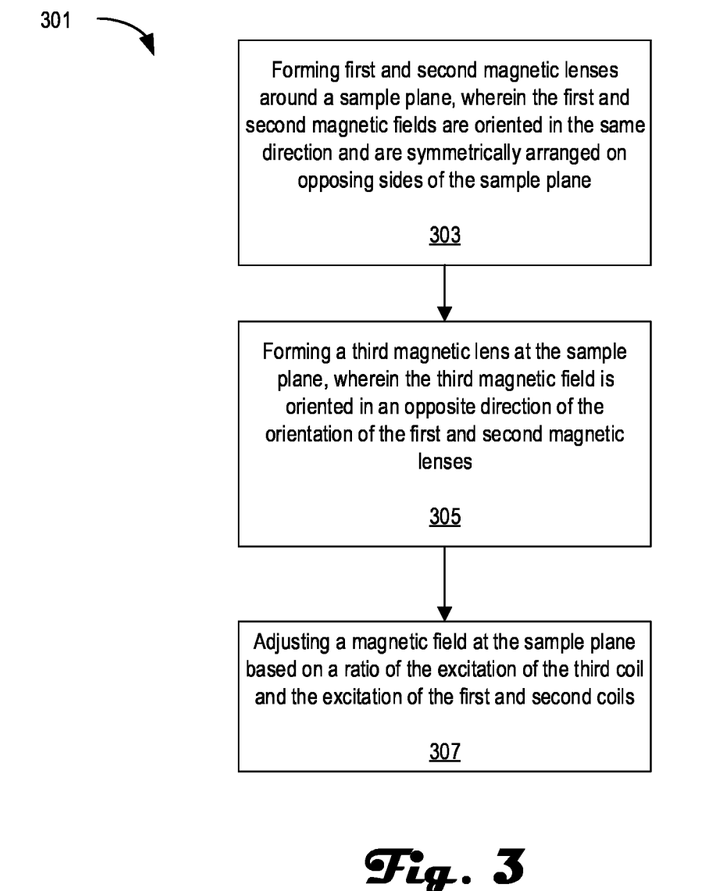
FIG. 3 is an example method for adjusting a magnetic field at a sample plane of a charged particle microscope in accordance with an embodiment of the present disclosure.

FIG. 3 is an example method 301 for adjusting a magnetic field at a sample plane of a charged particle microscope in accordance with an embodiment of the present disclosure. The method 301 may be implemented in a charged particle microscope, such as CPM 100 for example. The method 301 may be used to study magnetic materials that are problematic to study in conventional CPMs that typically have strong magnetic fields at the sample plane. By implementing the method 301, such materials may be studied with zero magnetic field present, or the presence of a small magnetic field.

Method 301 may begin at process block 303, which includes forming first and second magnetic lenses around a sample plane. The first and second magnetic lenses may be formed by first and second optical elements, such as optical elements 220 and 222. For example, first and second coils associated with the first and second optical elements may be excited to form the first and second magnetic lenses, which may be formed on opposing sides of the sample plane. In some embodiments, the excitation of the first and second coils may be symmetric at least with regards to the sign of the excitation. The symmetric excitation may result in magnetic field lenses generated in the same direction, at least with respect to an optical axis of an implementing CPM. In some embodiments, the excitation may also be symmetric with respect to the magnitude of the excitation, not just the sign of the coil current. In other embodiments, however, one magnetic lens may be formed from an optical element being excited at a fraction or multiple of the excitation of the other optical element, where the multiple is with regards to the magnitude of the excitation. The multiple may be in the range of 0.5 to 2, for example. In such an embodiment, the bias orientation will be the same, but the magnitude of the bias may be different between the two excitations.

Process block 303 may be followed by process block 305, which includes forming a third magnetic lens at the sample plane. The third magnetic field lens may be oriented in an opposite direction of the orientation of the first and second magnetic lenses. The third magnetic lens may be generated by exciting a third optical element, i.e., third and/or fourth coils. If both the third and fourth coils are excited, they may be symmetrically energized. Coils 244 and 246 are examples of the third and fourth coils. It should also be noted that the magnitude of the excitation of the first and second optical elements and the third optical element will be different as well. For example, the magnitude of the excitation of the first and second optical elements may greater than the magnitude of the excitation of the third optical element. In some embodiments, the first and second optical elements will be excited at 4000 AT and the third optical element will be excited at −18 AT.

Process block 305 may be followed by process block 307, which includes adjusting a magnetic field at the sample plane based on a ratio of the excitation of the third coil to the excitation of the first and second coils. The ratio of the excitations adjusts the amount of magnetic field in the axial direction, e.g., z-direction or in the direction of the optical axis. The excitations can be chosen for a given sample or a given image acquisition to generate a desired magnetic field at the sample plane, such as zero magnetic field or a small magnetic field. A small magnetic field as referred to herein is a magnetic field of a magnitude usually ranging between around 0.001 Tesla and around 0.1 Tesla, but sometimes as small as also ranging between 0.0001T and 0.001T, and sometimes as large as also ranging between 0.1T and 0.5T.

Figure 4A:
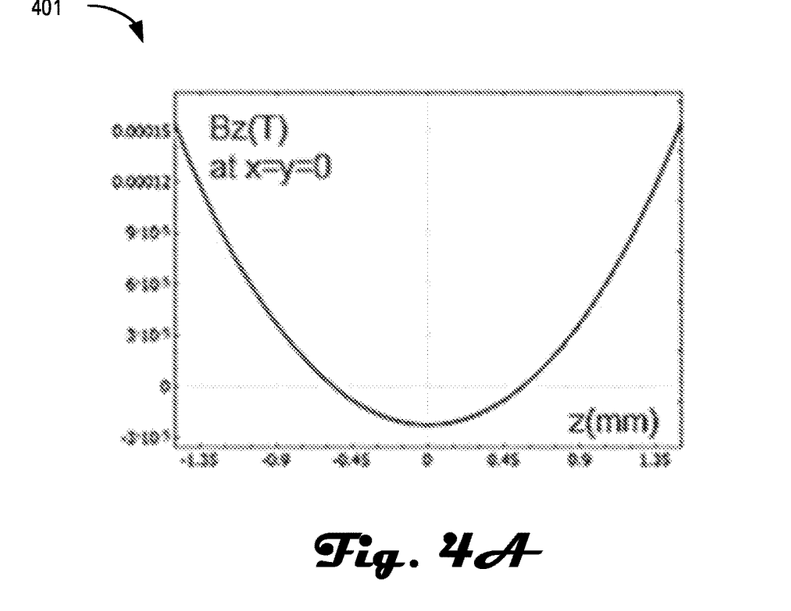
FIGS. 4A and 4B are example magnetic field plots in accordance with an embodiment of the present disclosure.
Figure 4B:
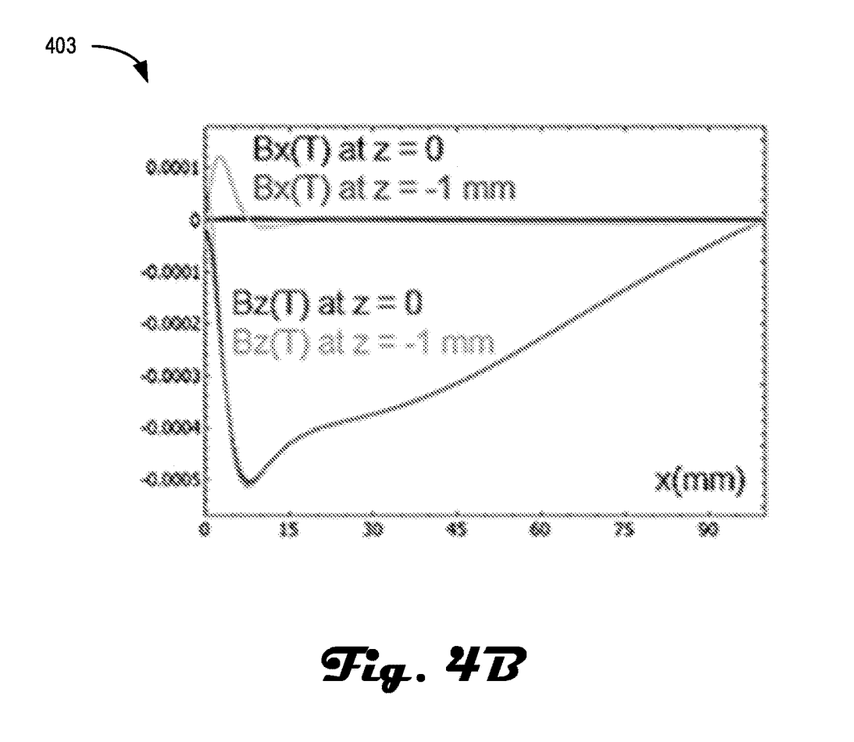

FIGS. 4A and 4B are example magnetic field plots 401 and 403, respectively, in accordance with an embodiment of the present disclosure. The data shown in plots 401 and 403 are indicative of the magnetic field strength with respect to the sample plane, such as sample planes 108 and 208, in the Z and X directions, respectively, and with an objective lens, such as objective lens 106 and 206, excited as disclosed herein. For example, first and second optical elements may be excited at 4000 AT, while the third optical element is excited at −18 AT, which minimizes the magnetic field at the sample plane. Plot 401 illustrates the change in the z-component of the magnetic field at different locations on the optical axis around the sample plane. In plot 401, the sample plane is location zero (0) on the x-axis of the plot, and the magnetic field is very small at this location, as indicated by the plot. Based on the plot (y-axis), the magnetic field at z=0 is less than $3.0 \times 10^{-5}$ T. Changing either the excitation of the main lenses, the auxiliary lenses, or both, the magnetic field at z=0 can be made zero.

Plot 403 shows the magnetic field in the x-direction (perpendicular to the optical axis), which includes representation of the x and z components of the magnetic field in the X-direction. As shown, the x component of the magnetic field is zero at z=0 and is slightly present at z=−1 mm. Additionally, the z component of the magnetic field increases with increasing x distance to a maximum before slowly reducing. Such data indicates that the objective lens may need to be de-excited when magnetic samples are loaded/unloaded into a charged particle microscope.

Figure 5:
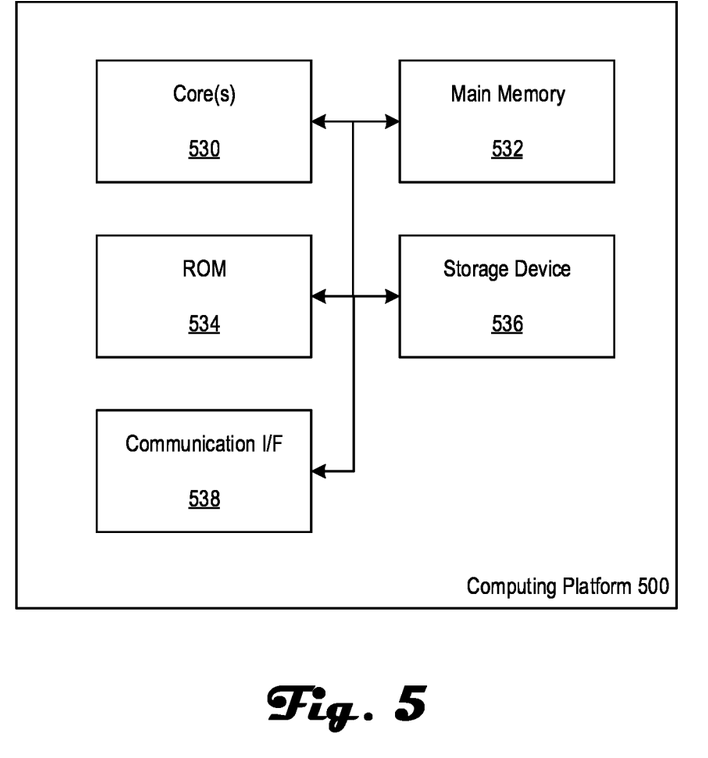
FIG. 5 is an example functional block diagram in accordance with an embodiment of the present disclosure.

FIG. 5 is an example functional block diagram 500 in accordance with an embodiment of the present disclosure. FIG. 5 is a block diagram that illustrates a computer system 500 that can be used to implement an embodiment of the present disclosure. The computing system 500 may be an example of computing hardware included with system 100. Computer system 500 at least includes a hardware processor, such as core(s) 530 for processing information, which may be coupled to a communication bus. The computing system 500 may be used to implement the methods and techniques disclosed herein, such as method 301, and may also be used to obtain images based on the synchronization of the scanning of the sample with the pulse period of a pulsed electron beam.

Computer system 500 also includes a main memory 532, such as a random access memory (RAM) or other dynamic storage device, coupled to a bus for storing information and instructions to be executed by core(s) 530. Main memory 532 also may be used for storing temporary variables or other intermediate information during execution of instructions to be executed by core 530. Such instructions, when stored in non-transitory storage media accessible to core 530, render computer system 500 into a special-purpose machine that is customized to perform the operations specified in the instructions.

Computer system 500 further includes a read only memory (ROM) 534 or other static storage device coupled to the bus for storing static information and instructions for core 530. A storage device 536, such as a magnetic disk or optical disk, is provided and coupled to the bus for storing information and instructions.

Computer system 500 may be coupled via the bus to a display, such as display 31, for displaying information to a computer user. An input device 33, including alphanumeric and other keys, is coupled to the bus for communicating information and command selections to core 530. Another type of user input device is cursor control, such as a mouse, a trackball, or cursor direction keys for communicating direction information and command selections to core 530 and for controlling cursor movement on the display. This input device typically has two degrees of freedom in two axes, a first axis (e.g., x) and a second axis (e.g., y), that allows the device to specify positions in a plane.

Computer system 500 may implement the techniques described herein using customized hard-wired logic, one or more ASICs or FPGAs, firmware and/or program logic which in combination with the computer system causes or programs computer system 500 to be a special-purpose machine. According to one embodiment, the techniques herein are performed by computer system 500 in response to core(s) 530 executing one or more sequences of one or more instructions contained in main memory 532. Such instructions may be read into main memory 532 from another storage medium, such as storage device 536. Execution of the sequences of instructions contained in main memory 532 causes core 530 to perform the process steps described herein. In alternative embodiments, hard-wired circuitry may be used in place of or in combination with software instructions.

The term "storage media" as used herein refers to any non-transitory media that store data and/or instructions that cause a machine to operate in a specific fashion. Such storage media may comprise non-volatile media and/or volatile media. Non-volatile media includes, for example, optical or magnetic disks, such as storage device 536. Volatile media includes dynamic memory, such as main memory 532. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, content-addressable memory (CAM), and ternary content-addressable memory (TCAM).

Storage media is distinct from but may be used in conjunction with transmission media. Transmission media participates in transferring information between storage media. For example, transmission media includes coaxial cables, copper wire and fiber optics, including the wires that comprise bus 640. Transmission media can also take the form of acoustic or light waves, such as those generated during radio-wave and infra-red data communications.

Various forms of media may be involved in carrying one or more sequences of one or more instructions to core 530 for execution. For example, the instructions may initially be carried on a magnetic disk or solid state drive of a remote computer. The remote computer can load the instructions into its dynamic memory and send the instructions over a network.

Computer system 500 also includes a communication interface 538 coupled to the bus. Communication interface 538 provides a two-way data communication coupling to a network link (not shown) that is connected to a local network. For example, communication interface 538 may be an integrated services digital network (ISDN) card, cable modem, satellite modem, or a modem to provide a data communication connection to a corresponding type of telephone line. As another example, communication interface 538 may be a local area network (LAN) card to provide a data communication connection to a compatible LAN. Wireless links may also be implemented. In any such implementation, communication interface 538 sends and receives electrical, electromagnetic or optical signals that carry digital data streams representing various types of information.

Computer system 500 can send messages and receive data, including program code, through network(s), a network link and communication interface 538. In the Internet example, a server might transmit a requested code for an application program through the Internet via an ISP, local network and/or communication interface 538.

The received code may be executed by core 530 as it is received, and/or stored in storage device 536, or other non-volatile storage for later execution.

The embodiments discussed herein to illustrate the disclosed techniques should not be considered limiting and only provide examples of implementation. Those skilled in the art will understand the other myriad ways of how the disclosed techniques may be implemented, which are contemplated herein and are within the bounds of the disclosure.

An example apparatus for implementing the disclosed techniques, such as changing a magnetic field in a sample plane of an electron microscope, such as a TEM or an STEM, at least includes first and second optical elements, the first and second optical elements arranged around the sample plane. The arrangement of the first and second optical elements can be above and below the sample plane, where above and below are along an optical axis of the electron microscope. The microscope further includes a third optical element, also arranged around the sample plane. Additionally, the electron microscope includes a controller coupled to control the first, second and third optical elements to affect the magnetic field at the sample plane. The controller may be coupled to or including non-transitory memory storing code that, when executed by the controller, causes the controller to excite the first and second optical elements to generate first and second magnetic lenses formed around the sample plane, the first and second lenses oriented in the same direction; and excite the third optical element to generate a third magnetic lens at the sample plane, the third magnetic lens oriented in an opposite direction to the first and second magnetic lenses, and wherein a ratio of the excitation of the first and second optical elements to the excitation of the third optical element adjusts a magnetic field at the sample plane. The adjustment of the magnetic field us due to the interaction at the sample plane of the third magnetic lens and magnetic fields present at the sample plane from the first and second magnetic lenses.

The example apparatus of above where the ratio of the excitation of the first and second optical elements to the excitation of the third optical element eliminates an axial component of the magnetic field at the sample plane.

The example apparatus of any of the above where the excitation of the first and second optical elements is between 2000 and 8000 ampere-turns and the excitation of the third optical element is between −1 and −400 ampere-turns.

The example apparatus of any of the above where the ratio of the excitation of the first and second optical elements to the excitation of the third optical element generates an immersion lens at the sample plane.

The example apparatus of any of the above where the excitation of the first and second optical elements is less than 2000 ampere-turns and the excitation of the third optical element is between 2000 and 8000 ampere-turns.

The example apparatus of any of the above where a magnitude of the second excitation is a multiple of a magnitude of the first excitation.

The example apparatus of any of the above where the multiple is in a range of 0.5 to 2.

The example apparatus of any of the above where the first and second optical elements include first and second coils, respectively, and first and second yokes, respectively, and where each of the first and second yokes includes pole pieces that extend toward the sample plane from opposite sides.

The example apparatus of any of the above where the third optical element includes third and fourth coils, where the third coil is arranged adjacent to the first optical element, and wherein the fourth coils is arranged adjacent to the second optical element.

The example apparatus of any of the above where the excitation of the third optical element includes exciting only the third coil.

The example apparatus of any of the above where the excitation of the third optical element includes exciting the third and fourth coils with the same excitation.

An example method for implementing the disclosed techniques, such as changing a magnetic field in a sample plane of an electron microscope, such as a TEM or an STEM, at least includes based on an excitation of first and second coils, forming first and second magnetic lenses around a sample plane, wherein the first and second magnetic fields are oriented in the same direction and are symmetrically arranged on opposing sides of the sample plane, based on an excitation of a third coil, forming a third magnetic lens at the sample plane, wherein the third magnetic field is oriented in an opposite direction of the orientation of the first and second magnetic lenses; and based on a ratio of the excitation of the third coil to the excitation of the first and second coils to the excitation of the at least third coil, adjusting a magnetic field at the sample plane.

The example method of above where the ratio of the excitation of the first and second coils to the excitation of the at least third coil eliminates an axial component of the magnetic field at the sample plane.

The example method of any of the above where the excitation of the first and second coils is between 2000 and 8000 ampere-turns and the excitation of the third optical element is between 1 and 400 ampere-turns.

The example method of any of the above where the ratio of the excitation of the first and second coils to the excitation of the at least third coil generates an immersion lens at the sample plane.

The example method of any of the above where the excitation of the first and second coils is less than 2000 ampere-turns and the excitation of the third optical element is between 2000 and 8000 ampere-turns.

The example method of any of the above where the ratio of the excitation of the first and second coils to the excitation of the at least third coil generates a small magnetic field at the sample plane.

The example method of any of the above where the excitation of the first and second coils is between 2000 and 8000 ampere-turns and the excitation of the at least third coil is between −1 and −400 ampere-turns.

The example method of any of the above where a magnitude of the excitation of the at least third coils is a multiple of a magnitude of the excitations of the first and second coils.

The example method of any of the above where the multiple is 0.5 to 2.

The example method of any of the above where a fourth coil is excited when forming the third magnetic lens at the sample plane, the fourth coil excited the same as the third coil.

What is claimed is:

1. An apparatus comprising:
    first and second optical elements arranged on opposing sides of a sample plane;
    a third optical element arranged on one or both of the opposing sides of the sample plane; and
    a controller coupled to control the first, second and third optical elements, the controller coupled to or including non-transitory memory storing code that, when executed by the controller, causes the controller to:
        excite the first and second optical elements to generate first and second magnetic lenses, the first and second magnetic lenses formed on opposing sides of the sample plane, wherein the first and second lenses are oriented in the same direction; and
        excite the third optical element to generate a third magnetic lens, the third magnetic lens formed at the sample plane, wherein the third magnetic lens is oriented in an opposite direction to the first and second magnetic lenses, and
    wherein a ratio of the excitation of the third optical element to the excitation of the first and second optical elements adjusts a magnetic field at the sample plane.

2. The apparatus of claim 1, wherein the ratio of the excitation of the third optical element to the excitation of the first and second optical elements negates an axial component of the magnetic field at the sample plane.

3. The apparatus of claim 2, wherein the excitation of the first and second optical elements is between 2000 and 8000 ampere-turns and the excitation of the third optical element is between −1 and −400 ampere-turns.

4. The apparatus of claim 1, wherein the ratio of the excitation of the third optical element to the excitation of the first and second optical elements generates a small magnetic field at the sample plane.

5. The apparatus of claim 4, wherein the excitation of the first and second optical elements is between 2000 and 8000 ampere-turns and the excitation of the third optical element is between −1 and −400 ampere-turns.

6. The apparatus of claim 1, wherein the ratio of the excitation of the first and second optical elements to the excitation of the third optical element generates an immersion lens at the sample plane.

7. The apparatus of claim 6, wherein the excitation of the first and second optical elements is less than 2000 ampere-turns and the excitation of the third optical element is between 2000 and 8000 ampere-turns.

8. The apparatus of claim 1, wherein a magnitude of the excitation of the third optical element is a multiple of a magnitude of the excitation of the first and second optical elements.

9. The apparatus of claim 8, wherein the multiple is in a range of 0.5 to 2.

10. The apparatus of claim 1, wherein the first and second optical elements include:
    first and second coils, respectively; and
    first and second yokes, respectively,
    wherein each of the first and second yokes includes pole pieces that extend toward the sample plane.

11. The apparatus of claim 1, wherein the third optical element includes third and fourth coils, wherein the third coil is arranged adjacent to the first optical element, and wherein the fourth coil is arranged adjacent to the second optical element.

12. The apparatus of claim 11, wherein the excitation of the third optical element includes exciting only the third coil.

13. The apparatus of claim 11, wherein the excitation of the third optical element includes exciting the third and fourth coils with the same excitation.

14. A method comprising:
    based on an excitation of first and second coils, forming first and second magnetic lenses around a sample plane, wherein the first and second magnetic fields are oriented in the same direction and are symmetrically arranged on opposing sides of the sample plane;
    based on an excitation of a third coil, forming a third magnetic lens at the sample plane, wherein the third magnetic field is oriented in an opposite direction of the orientation of the first and second magnetic lenses; and
    based on a ratio of the excitation of the third coil to the excitation of the first and second coils, adjusting a magnetic field at the sample plane.

15. The method of claim 14, wherein the ratio of the excitation of the first and second coils to the excitation of the at least third coil eliminates an axial component of the magnetic field at the sample plane.

16. The method of claim 15, wherein the excitation of the first and second coils is between 2000 and 8000 ampere-turns and the excitation of the third optical element is between 1 and 400 ampere-turns.

17. The method of claim 14, wherein the ratio of the excitation of the first and second coils to the excitation of the at least third coil generates an immersion lens at the sample plane.

18. The method of claim 17, wherein the excitation of the first and second coils is less than 2000 ampere-turns and the excitation of the third optical element is between 2000 and 8000 ampere-turns.

19. The method of claim 14, wherein the ratio of the excitation of the first and second coils to the excitation of the at least third coil generates a small magnetic field at the sample plane.

20. The method of claim 19, wherein the excitation of the first and second coils is between 2000 and 8000 ampere-turns and the excitation of the at least third coil is between −1 and −400 ampere-turns.

21. The method of claim 14, wherein a magnitude of the excitation of the third coil is a multiple of a magnitude of the excitations of the first and second coils.

22. The method of claim 21, wherein the multiple is 0.5 to 2.

23. The method of claim 14, wherein a fourth coil is excited when forming the third magnetic lens at the sample plane, the fourth coil excited the same as the third coil.

\* \* \* \* \*